United States Patent
Dai et al.

(10) Patent No.: US 9,882,400 B2
(45) Date of Patent: Jan. 30, 2018

(54) POWER CABINET MANAGEMENT METHOD AND APPARATUS, AND BATTERY MANAGEMENT SYSTEM

(71) Applicant: Ningde Contemporary Amperex Technology Limited, Ningde (CN)

(72) Inventors: Jinzhen Dai, Ningde (CN); Jingyao Mei, Ningde (CN); Jianguo Hu, Ningde (CN)

(73) Assignee: Contemporary Amperex Technology Co., Limited, Jiaocheng Zone, Ningde (CN)

( * ) Notice: Subject to any disclaimer, the term of this patent is extended or adjusted under 35 U.S.C. 154(b) by 0 days.

(21) Appl. No.: 14/945,398

(22) Filed: Nov. 18, 2015

(65) Prior Publication Data

US 2016/0149422 A1     May 26, 2016

(30) Foreign Application Priority Data

Nov. 20, 2014    (CN) .......................... 2014 1 0668530

(51) Int. Cl.
*H02J 7/00* (2006.01)
*G06F 1/26* (2006.01)
*G01R 31/36* (2006.01)

(52) U.S. Cl.
CPC ........ *H02J 7/0021* (2013.01); *G01R 31/3606* (2013.01); *G06F 1/26* (2013.01); *H02J 7/0068* (2013.01)

(58) Field of Classification Search
CPC ... G06F 1/88; G06F 1/263; G06F 1/30; G06F 1/188; G06F 1/26; H01M 10/425;
(Continued)

(56) References Cited

U.S. PATENT DOCUMENTS

2006/0012330 A1* 1/2006 Okumura ........... G01R 31/3679
                                                  320/103
2009/0023053 A1* 1/2009 Berdichevsky ..... H01M 10/425
                                                      429/61
(Continued)

FOREIGN PATENT DOCUMENTS

CN       102315648 A     1/2012
CN       102437603        5/2012
(Continued)

OTHER PUBLICATIONS

Chinese Office action dated Feb. 1, 2016 for application No. 201410668530.3 with English translation.
(Continued)

*Primary Examiner* — Terrell Johnson
(74) *Attorney, Agent, or Firm* — Ladas & Parry, LLP (57) ABSTRACT

A power cabinet management method, a power cabinet management apparatus and a battery management system are provided. The power cabinet management method includes: detecting a running state of each battery power cabinet in a battery power cabinet array in real time, allowing a detected faulty battery power cabinet to exit from the battery power cabinet array, and excluding the faulty battery power cabinet from parameter calculation of the battery power cabinet array. When a certain battery power cabinet in a battery power cabinet array of a battery energy storage system fails, the faulty battery power cabinet can automatically exit without affecting the normal operation of the entire battery energy storage system.

6 Claims, 5 Drawing Sheets

(58) Field of Classification Search
CPC .. H01M 10/441; H01M 10/482; H02J 7/0031; H02J 7/0022; H02J 9/06; H02J 7/0021; H02J 7/0068; Y02T 10/7055; G01R 31/3606; G01R 31/362; G01R 31/3679; G01R 31/3689

See application file for complete search history.

(56) References Cited

U.S. PATENT DOCUMENTS

| | | | | |
|---|---|---|---|---|
| 2009/0278701 | A1* | 11/2009 | Reams | G01R 31/362 340/636.15 |
| 2012/0013201 | A1* | 1/2012 | Pariseau | H01M 10/48 307/125 |
| 2013/0093397 | A1* | 4/2013 | Chan | H01M 2/202 320/128 |
| 2014/0232350 | A1* | 8/2014 | Chan | G06F 1/263 320/134 |

FOREIGN PATENT DOCUMENTS

| | | |
|---|---|---|
| CN | 104104118 | 10/2014 |
| JP | 2009-5544 A | 1/2009 |
| JP | 2010-252566 A | 11/2010 |

OTHER PUBLICATIONS

Chinese Office action dated Oct. 8, 2016 for application No. 201410668530.3 with English translation.
Search Report dated Jan. 25, 2016 for Chinese application No. No. 2014106685303.
Japanese Office action dated Sep. 27, 2016 for application No. 2015-215543 with English translation.
3rd Chinese Office action dated Apr. 1, 2017 for CN application No. 201410668530.3 with English translation.
Fourth Office Action for Chinese Application No. 2014106685303 dated Oct. 19, 2017, with machine Enghsh translation provided by foreign associate.

* cited by examiner

POWER CABINET MANAGEMENT METHOD AND APPARATUS, AND BATTERY MANAGEMENT SYSTEM

CROSS-REFERENCE TO RELATED APPLICATION

This application claims the benefit of and priority to Chinese Patent Application No. 201410668530.3 filed on Nov. 20, 2014, the disclosure of which is hereby incorporated by reference in its entirety.

FIELD OF THE INVENTION

The present application relates to the technical field of energy storage, and particularly relates to a power cabinet management method and apparatus, and a battery management system.

BACKGROUND

A battery energy storage system may solve the problems of the randomness and fluctuation of power generation with new energy and electric car charging, may realize the smooth output of power generation with new energy, and can effectively adjust changes in the voltage, frequency and phase of a power grid caused by power generation with new energy and electric car charging. A battery energy storage system in the related art comprises an energy Management system (EMS), a power conversion system (PCS) and an energy storage unit, wherein the PCS comprises a power conversion part and a controller connected to each other by a switch device, and the energy storage unit comprises a battery pack and a battery Management system (BMS) connected to each other via a power wire.

In the related art, for convenience of placement, repair and maintenance of a battery, an energy storage unit is implemented by a battery power cabinet, a standard mounting structure is arranged in the battery power cabinet, and a power wire and a battery interface are deployed, such that a battery module is pluggable. In the related art, a plurality of battery power cabinets are connected to form an array, thereby implementing an energy storage unit in a battery energy storage system.

However, inventors have found that, when a certain battery power cabinet in a battery power cabinet array in the related art fails, the entire battery energy storage system needs to stop running, and thus the needs of system reliability cannot be matched.

SUMMARY OF THE INVENTION

To overcome the problems in the related art, the present application provides a power cabinet management method and apparatus, and a battery management system.

According to a first aspect of embodiments of the present application, there is provided a power cabinet management method, comprising: detecting each battery power cabinet in a battery power cabinet array in real time; allowing a detected faulty battery power cabinet to exit from the battery power cabinet array; and excluding the faulty battery power cabinet from parameter calculation of the battery power cabinet array.

According to a second aspect of embodiments of the present application, there is provided a power cabinet management apparatus, comprising: a first detecting module, configured to detect each battery power cabinet in a battery power cabinet array in real time; a cabinet exiting module, configured to allow a detected faulty battery power cabinet to exit from the battery power cabinet array; and an excluding module, configured to exclude the faulty battery power cabinet from parameter calculation of the battery power cabinet array.

According to a third aspect of an embodiment of the present application, there is provided a BMS, comprising: a processor; and a memory for storing a processor-executable instruction; wherein the processor is configured to: detect each battery power cabinet in a battery power cabinet array in real time; allow a faulty battery power cabinet to exit from the battery power cabinet array; and exclude the detected faulty battery power cabinet from parameter calculation of the battery power cabinet array.

The technical solutions provided by the embodiments of the present application may achieve the following beneficial effects: When a certain battery power cabinet in a battery power cabinet array of a battery energy storage system fails, the faulty battery power cabinet can automatically exit without affecting the normal operation of the entire battery energy storage system.

It should be understood that the foregoing general description and the detailed description hereinafter are only illustrative and interpretative but not for limiting the present application.

BRIEF DESCRIPTION OF THE DRAWINGS

The accompanying drawings herein, which are incorporated into and constitute a part of the specification, illustrate embodiments consistent with the present application, and together with the specification, serve to explain the principles of the present application.

DETAILED DESCRIPTION

The exemplary embodiments will be described hereinafter in detail, and the examples thereof are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

Figure 1:
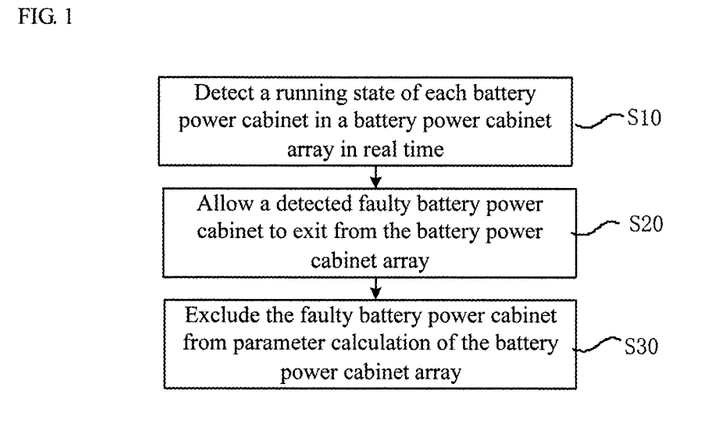
FIG. 1 is a flowchart illustrating a power cabinet management method according to one exemplary embodiment of the present application.

FIG. 1 is a flowchart illustrating a power cabinet management method according to one exemplary embodiment of the present application. The method comprises the following steps.

In step S10, a running state of each battery power cabinet in a battery power cabinet array is detected in real time.

Preferably, the voltage, current and communication status of each battery power cabinet may be monitored in real time by a BMS, and a detected faulty battery power cabinet is identified.

Voltage, current and communication status are main indicators determining whether a battery energy storage system can operate normally. In this preferred embodiment, the real-time monitoring of these indicators of cabinets can ensure that a cabinet possibly affecting the normal operation of the entire battery energy storage system is found in real time.

In addition, the real-time monitoring of the running state of the system is achieved by the BMS, such that automated monitoring is achieved and the burden of manual monitoring is reduced.

In step S20, a detected faulty battery power cabinet is allowed to exit from the battery power cabinet array.

An important difference between the embodiment and the related art is as follows: in the embodiment, only the faulty battery power cabinet exits, instead of allowing the entire battery energy storage system to stop running, thereby greatly improving the reliability of system operation.

Preferably, the BMS may request a power conversion system (PCS) to stop charging and discharging, and to disconnect high voltage of all sub-cabinets; the BMS requests the PCS to output high voltage to battery power cabinets except the faulty battery power cabinet identified; and the BMS requests the PCS to allow charging and discharging.

Figure 2:
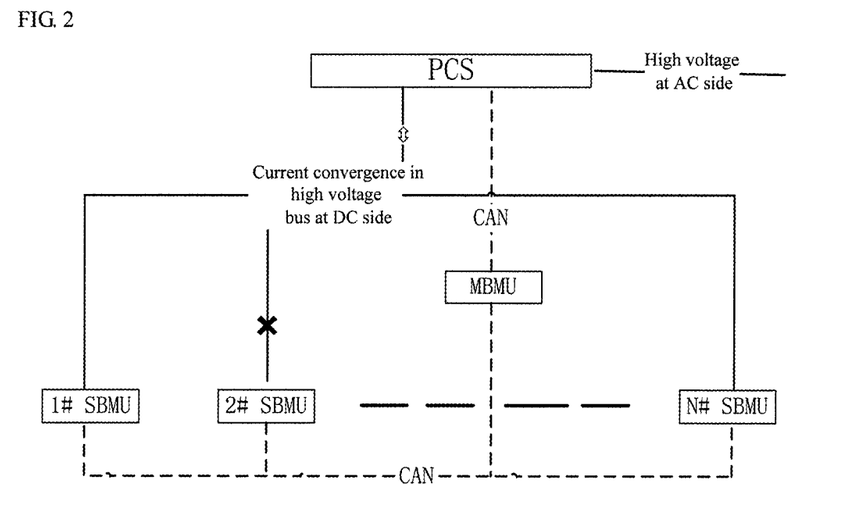
FIG. 2 is a schematic diagram of a battery energy storage system according to the embodiment illustrated in FIG. 1.

FIG. 2 is a schematic diagram of a battery energy storage system shown according to the embodiment of FIG. 1. In the Figure, "x" on a high voltage bus represents the absence of charging and discharging current and successful cabinet exiting; 1# SBMU (sub battery management unit) represents No. 1 cabinet; 2# SBMU represents No. 2 cabinet; N# SBMU represents No. N cabinet; a CAN (controller area network) bus is a communication line; and an MBMU (main battery management unit) is a main cabinet for management and is communicated with the PCS via the CAN bus.

In step S30, the faulty battery power cabinet is excluded from parameter calculation of the battery power cabinet array.

Figure 3:
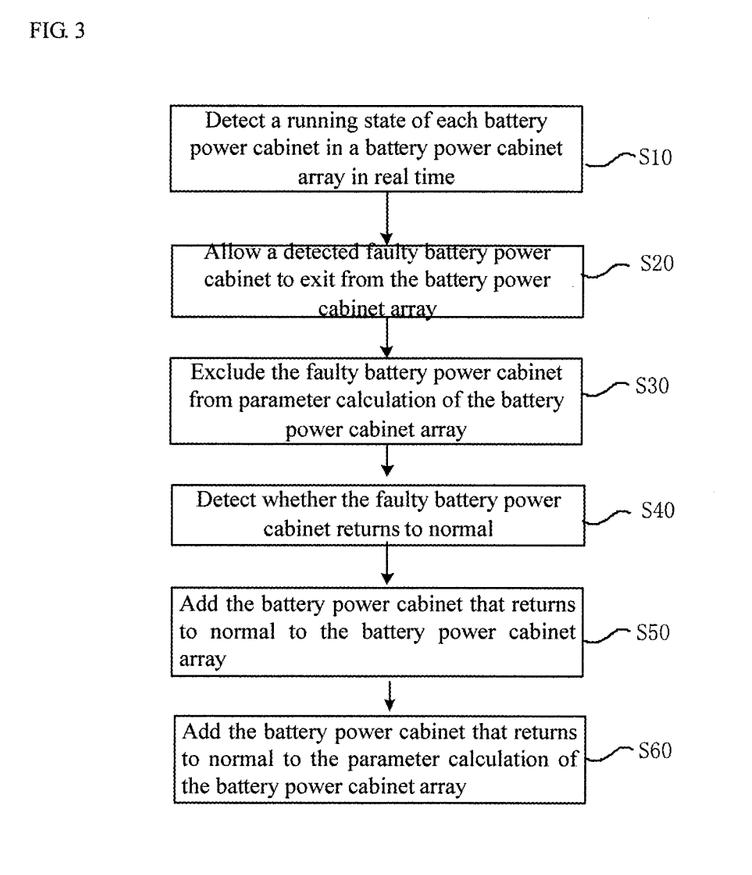
FIG. 3 is a flowchart illustrating a power cabinet management method according to another exemplary embodiment of the present application.

FIG. 3 is a flowchart illustrating a power cabinet management method according to another exemplary embodiment of the present application. The method further comprises the following steps.

In step S40, it is detected whether the faulty battery power cabinet returns to normal.

Preferably, the BMS detects whether the voltage, current and communication status of the faulty battery power cabinet meet a preset cabinet adding condition; and when the preset cabinet adding condition is met, determination is made that the faulty battery power cabinet returns to normal, and the fault identification of the battery power cabinet that returns to normal is cleared.

Voltage, current and communication status are main indicators determining whether a battery energy storage system can operate normally. In the preferred embodiment, the real-time monitoring of these indicators of cabinets can ensure that whether a cabinet has returned to normal is found in real time. For example, when judgment is made that a cabinet adding condition is met, the voltage difference should be different in the discharging and charging process, and in a stationary state. The voltage of cabinets powered on is Uon while the voltage of cabinets not powered on is Uoff. Uon>Uoff and Uon−Uoff<15 V in the overcharging process, Uon<Uoff and Uoff−Uon<15 V in the discharging process, and the voltage difference between Uon and Uoff is less than 8 V in a stationary state. Power-on may be tried only when the above voltage difference is met.

Real-time monitoring is achieved by the BMS, such that automated monitoring is achieved and the burden of manual monitoring is reduced.

In step S50, the battery power cabinet that returns to normal is added to the battery power cabinet array.

Preferably, the BMS may request the PCS to stop charging and discharging, and to disconnect high voltage; the BMS requests the PCS to output high voltage to all the battery power cabinets; and the BMS requests the PCS to allow charging and discharging.

Figure 4:
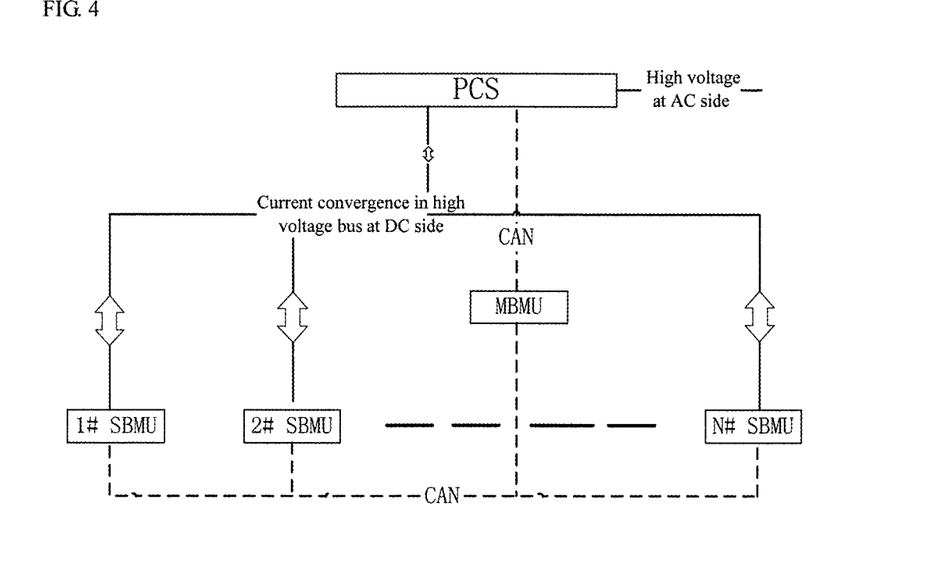
FIG. 4 is a schematic diagram illustrating a system architecture of a battery energy storage system in which all power cabinets are chargeable and dischargeable according to the embodiment illustrated in FIG. 3.

FIG. 4 is a schematic diagram illustrating a battery energy storage system shown according to the embodiment of FIG. 3. In the Figure, the identifier ⇔ means that a circuit of a high-voltage system can be charged and discharged, and shows that 2# SBMU which failed is automatically added successfully and can be normally charged and discharged, and the system operates normally.

In the above preferred embodiment, cabinet exiting or adding is performed only when charging and discharging are stopped, thus the disconnection or closing of a relay in the presence of current is not allowed.

In step S60, the battery power cabinet that returns to normal is added to the parameter calculation of the battery power cabinet array.

Whether running at reduced power may be realized should be determined by system parameters which can be calibrated/read-written. In an embodiment of the present application, a faulty cabinet is timely excluded from parameter calculation or a cabinet that returns to normal is timely added to parameter calculation in cabinet exiting and adding operations, thereby being capable of realizing the normal operation of the battery energy storage system at proper power.

Figure 5:
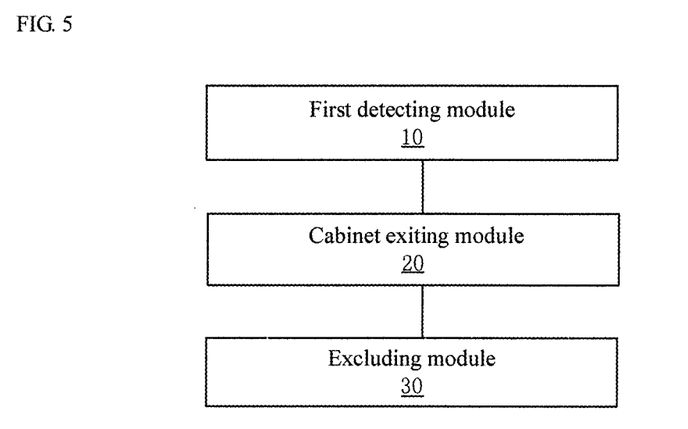
FIG. 5 is a schematic block diagram illustrating a power cabinet management apparatus for implementing power cabinet management according to one exemplary embodiment of the present application.

FIG. 5 is a block diagram illustrating a power cabinet management apparatus according to one exemplary embodiment of the present application. The cabinet management apparatus comprises: a first detecting module 10, configured to detect each battery power cabinet in a battery power cabinet array in real time; a cabinet exiting module 20, configured to allow a detected faulty battery power cabinet to exit from the battery power cabinet array; and an excluding module 30, configured to allow the faulty battery power cabinet from parameter calculation of the battery power cabinet array.

The power cabinet management apparatus according to the embodiment achieves the following beneficial effects: when a certain battery power cabinet fails, the faulty battery power cabinet can automatically exit without affecting the normal operation of the entire battery energy storage system.

Figure 6:
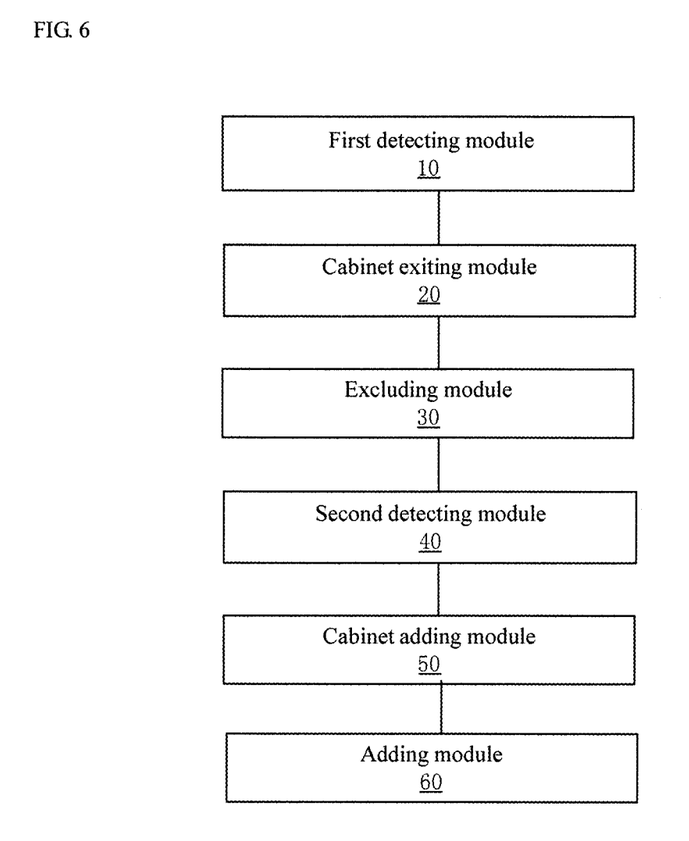
FIG. 6 is a detailed block diagram illustrating a power cabinet management apparatus for implementing power cabinet management according to another exemplary embodiment of the present application.

FIG. 6 is a block diagram illustrating a power cabinet management apparatus according to another exemplary embodiment according to the present application. The power cabinet management apparatus further comprises: a second detecting module 40, configured to detect whether the faulty battery power cabinet returns to normal; a cabinet adding module 50, configured to add the battery power cabinet that returns to normal to the battery power cabinet array; and an adding module 60, configured to add the battery power cabinet that returns to normal to the parameter calculation of the battery power cabinet array.

The power cabinet management apparatus according to the embodiment achieves the following beneficial effects: When a certain faulty battery power cabinet returns to normal, the battery power cabinet can be automatically added without affecting the normal operation of the entire battery energy storage system.

Figure 7:
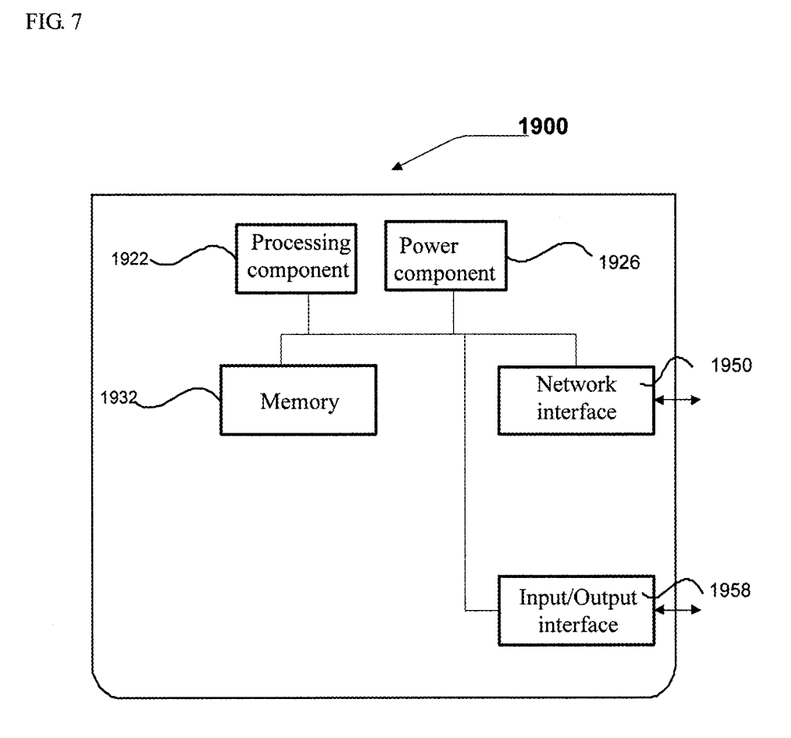
FIG. 7 is a block diagram illustrating constitution of an energy storage system according to one exemplary embodiment of the present application.

FIG. 7 is a block diagram of a BMS shown according to one exemplary embodiment. A BMS 1900 comprises a processing component 1922, and further comprises one or more processors, and memory resources represented by a memory 1932 to store an instruction (e.g., an application program) executable by the processing component 1922. An application program stored in the memory 1932 may comprise one or more than one modules, each of which corresponds to a set of instructions. Furthermore, the processing component 1922 is configured to execute an instruction to execute the operations of: detecting each battery power cabinet in a battery power cabinet array in real time; allowing a detected faulty battery power cabinet to exit from the battery power cabinet array; and excluding the faulty battery power cabinet from parameter calculation of the battery power cabinet array.

In the above BMS, the processing component 1922 is further configured to execute the operations of: detecting whether the faulty battery power cabinet returns to normal; adding the battery power cabinet that returns to normal to the battery power cabinet array; and adding the battery power cabinet that returns to normal to the parameter calculation of the battery power cabinet array.

The apparatus 1900 may further comprise: a power component 1926, configured to execute the power supply management in the apparatus 1900; a wired or wireless network interface 1950, configured to connect the apparatus 1900 to a network; and an input/output (I/O) interface 1958. The apparatus 1900 may operate based on an operating system stored in the memory 1932, for example, Windows Server, Mac OS X, Unix, Linux, FreeBSD, or the like.

In an exemplary embodiment, a non-transitory computer-readable storage medium is provided, and a power cabinet management method can be executed by the BMS when an instruction in the storage medium is executed by the processor of the BMS, wherein the method comprises: detecting each battery power cabinet in a battery power cabinet array in real time; allowing a detected faulty battery power cabinet to exit from the battery power cabinet array; and excluding the faulty battery power cabinet from parameter calculation of the battery power cabinet array. The method may further comprise: detecting whether the faulty battery power cabinet returns to normal; adding the battery power cabinet that returns to normal to the battery power cabinet array; and adding the battery power cabinet that returns to normal to the parameter calculation of the battery power cabinet array.

By reading the above text, those skilled in the art may recognize that the above embodiments of the present application achieve the following technical effects:

1. When a certain cabinet in a battery power cabinet array fails, the faulty cabinet can automatically exit without affecting the normal operation of the entire energy storage system.

2. After the fault of a certain cabinet is eliminated, the system automatically judges that cabinets meeting operating requirements are automatically incorporated into the entire system without human intervention.

Apparently, those skilled in the art should understand that, the above various modules or steps of the present application may be implemented by a general-purpose computing device, may be centralized on a single computing device or distributed on a network formed by a plurality of calculating devices, and optionally, may be implemented by program code executable by a computing device, and therefore may be stored in a storage device and executed by a computing device, or may be implemented by being respectively made into various integrated circuit modules, or by integrating a plurality of modules or steps thereof into a single integrated circuit module. In this way, the present application is not limited to any specific combination of hardware and software.

Other embodiments of the present invention will be easily contemplated by those skilled in the art after consideration of the specification and the practice of the invention disclosed herein. The present application is intended to cover any variations, uses or adaptive changes of the present invention, and these variations, uses or adaptive changes follow the general principles of the present invention and comprise the common general knowledge or conventional technical means in the technical field which are not disclosed in the present application. The specification and embodiments are considered to be exemplary only, and the true scope and spirit of the present invention are indicated by the following claims.

It should be understood that the present invention is not limited to exact structures which have been described above and shown in the accompanying drawings, and various modifications and changes may be made without departing from the scope thereof. The scope of the present invention is only defined by the appended claims.

What is claimed is:

1. A method for managing battery power storage cabinet by a battery management system (BMS), comprising steps of:

automatically detecting and storing, by the BMS, a running state of each battery power cabinet in a battery power cabinet array in real time;

analyzing, by the BMS, the running state detected in real time, and acquiring information of a faulty battery power cabinet;

allowing, by the BMS, a detected faulty battery power cabinet to exit from the battery power cabinet array according to the acquired information of the faulty battery power cabinet;

excluding, by the BMS, parameters of the detected faulty battery power cabinet from parameter calculation of the battery power cabinet array;

automatically detecting, by the BMS, state of whether the faulty battery power cabinet in real time;

when it is detected and analyzed that the state of the faulty battery power cabinet returns to normal, adding, by the BMS, the battery power cabinet that returns to normal to the battery power cabinet array; and adding, by the BMS, the parameters of the battery power cabinet that returns to normal to the parameter calculation of the battery power cabinet array;

wherein the step of allowing, by the BMS, a detected faulty battery power cabinet to exit from the battery power cabinet array according to the acquired information of the faulty battery power cabinet, comprises:

requesting, by the BMS, a power conversion system (PCS) to stop charging and discharging, and to disconnect high voltage of all sub-cabinets;

requesting, by the BMS, the PCS to output high voltage to battery power cabinets except the faulty battery power cabinet identified; and sending, by the BMS, a request to the PCS to restore charging and discharging of the battery power cabinets except the faulty battery power cabinet identified.

2. The method according to claim 1, wherein: voltage, current and communication status of each battery power cabinet are monitored in real time by the BMS to identify a detected faulty battery power cabinet.

3. The method according to claim 2, wherein the detecting whether the faulty battery power cabinet returns to normal comprises:

detecting by the BMS, whether voltage, current and communication status of the faulty battery power cabinet meet a preset cabinet adding condition; and when the preset cabinet adding condition is met, determining that the faulty battery power cabinet returns to normal, and clearing the identification of the battery power cabinet that returns to normal.

4. The method according to claim 3, wherein the adding the battery power cabinet that returns to normal to the battery power cabinet array comprises:

requesting the PCS by the BMS to stop charging and discharging, and to disconnect high voltage;

requesting the PCS by the BMS to output high voltage to all the battery power cabinets; and requesting the PCS by the BMS to allow charging and discharging.

5. A power cabinet management apparatus, comprising:

a first detecting module, configured to automatically detect and store a running state of each battery power cabinet in a battery power cabinet array in real time, and the first detecting module is further configured to analyze the running state detected in real time, and acquire information of a faulty battery power cabinet;

a cabinet exiting module, configured to allow a detected faulty battery power cabinet to exit from the battery power cabinet array according to the acquired information of the faulty battery power cabinet;

an excluding module, configured to exclude parameters of the faulty battery power cabinet from parameter calculation of the battery power cabinet array;

a second detecting module, configured to automatically detect state of the faulty battery power cabinet in real time;

a cabinet adding module, configured to, when the second detecting module detected and analyzed that the state of the faulty battery power cabinet returns to normal, add the battery power cabinet that returns to normal to the battery power cabinet array; and an adding module, configured to add the parameters of the battery power cabinet that returns to normal to the parameter calculation of the battery power cabinet array;

wherein the excluding module is further configured to request a power conversion system (PCS) to stop charging and discharging, and to disconnect high voltage of all sub-cabinets; request the PCS to output high voltage to battery power cabinets except the faulty battery power cabinet identified; and send a request to the PCS to restore charging and discharging of the battery power cabinets except the faulty battery power cabinet identified.

6. A battery management system, comprising:

a processor; and a memory for storing a processor-executable instruction; wherein the processor is configured to:

automatically detect and store each battery power cabinet in a battery power cabinet array in real time;

analyze the running state detected in real time, and acquire information of a faulty battery power cabinet;

allow a detected faulty battery power cabinet to exit from the battery power cabinet array according to the acquired information of the faulty battery power cabinet; and exclude parameters of the faulty battery power cabinet from parameter calculation of the battery power cabinet array;

wherein the processor is further configured to:

automatically detect whether state of the faulty battery power cabinet in real time returns to normal;

when detected and analyzed that the state of the faulty battery power cabinet returns to normal, add the battery power cabinet that returns to normal to the battery power cabinet array; and add the parameters of the battery power cabinet that returns to normal to the parameter calculation of the battery power cabinet array;

wherein the processor is further configured to request a power conversion system (PCS) to stop charging and discharging, and to disconnect high voltage of all sub-cabinets; request the PCS to output high voltage to battery power cabinets except the faulty battery power cabinet identified; and send a request to the PCS to restore charging and discharging of the battery power cabinets except the faulty battery power cabinet identified.

* * * * *